US009570117B2

(12) United States Patent
Lung et al.

(10) Patent No.: US 9,570,117 B2
(45) Date of Patent: Feb. 14, 2017

(54) INTEGRATED CIRCUIT WITH INDEPENDENT PROGRAMMABILITY

(71) Applicant: Macronix International Co., Ltd., Hsinchu (TW)

(72) Inventors: Hsiang-Lan Lung, Kaohsiung (TW); Tu-Shun Chen, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 260 days.

(21) Appl. No.: 14/507,357

(22) Filed: Oct. 6, 2014

(65) Prior Publication Data

US 2016/0099028 A1    Apr. 7, 2016

(51) Int. Cl.
| | |
|---|---|
| G11C 5/14 | (2006.01) |
| G11C 16/30 | (2006.01) |
| G11C 11/4074 | (2006.01) |
| G11C 29/12 | (2006.01) |
| G11C 29/48 | (2006.01) |
| G11C 5/06 | (2006.01) |

(52) U.S. Cl.
CPC ............... *G11C 5/14* (2013.01); *G11C 5/143* (2013.01); *G11C 5/147* (2013.01); *G11C 11/4074* (2013.01); *G11C 16/30* (2013.01); *G11C 29/1201* (2013.01); *G11C 29/48* (2013.01); *G11C 5/063* (2013.01)

(58) Field of Classification Search
CPC .......... G11C 5/14; G11C 5/143; G11C 5/147; G11C 5/063; G11C 11/4074; G11C 16/30; G11C 29/1201; G11C 29/48
USPC ....................................................... 365/226
See application file for complete search history.

(56) References Cited

U.S. PATENT DOCUMENTS

| | | | | |
|---|---|---|---|---|
| 6,925,583 B1* | 8/2005 | Khu | .............. | G01R 31/318544 714/30 |
| 7,346,784 B1* | 3/2008 | Theron | .......... | G01R 31/318516 713/300 |
| 7,587,643 B1* | 9/2009 | Chopra | .......... | G01R 31/318544 714/726 |
| 7,788,558 B2* | 8/2010 | Shimooka | ...... | G01R 31/318536 714/726 |

(Continued)

OTHER PUBLICATIONS

Marriott, John, Equnox Application Note, Report No. AN101, "SPI and JTAG in-System Programming (ISP) guidelines for the Atmel ATmega AVR Flash Microcontroller Family," v. 1.07, Jun. 12, 2007, 27 pages.

(Continued)

*Primary Examiner* — Pho M Luu
(74) *Attorney, Agent, or Firm* — Haynes Beffel & Wolfeld LLP

(57) ABSTRACT

An integrated circuit includes circuitry performing memory operations. The power from only one of a first power lead and a second power lead is sufficient for the circuitry to operate. A package encasing the integrated circuit. Leads on the package electrically couple power and data from an exterior of the package to the integrated circuit encased by the package, including the first power lead, the second power lead, and a ground lead. An isolation circuit electrically couples the circuitry to the first power lead but not the second lead at a first time, and electrically couples the circuitry to the second power lead but not the first power lead at a second time.

20 Claims, 10 Drawing Sheets

(56) References Cited

U.S. PATENT DOCUMENTS

| | | | |
|---|---|---|---|
| 7,962,885 B2* | 6/2011 | Chakraborty .. | G01R 31/318583 |
| | | | 714/4.12 |
| 9,341,676 B2* | 5/2016 | Portolan ........ | G01R 31/318572 |
| 2008/0296697 A1 | 12/2008 | Hsu et al. | |

OTHER PUBLICATIONS

Atmel, 8-bit AVR RISC Microcontroller Application Note,Rev. 0943E-AVR-08/08, Aug. 2008, 12 pages.

* cited by examiner

INTEGRATED CIRCUIT WITH INDEPENDENT PROGRAMMABILITY

BACKGROUND OF THE INVENTION

Field of the Invention

The present invention relates to customized programming of integrated circuits, such as during manufacturing.

Description of Related Art

With In-System Programming (ISP), integrated circuits such as programmable logic devices, microcontrollers, and other embedded devices can be programmed while mounted in a printed circuit board or otherwise installed in a complete system, rather than requiring the chip to be programmed prior to installing it into the system.

An advantage of this ISP feature is that it allows manufacturers of electronic devices to integrate programming and testing into a single production phase, rather than requiring a separate programming stage prior to assembling the system. This may allow manufacturers to program the chips in their own system's production line instead of buying pre-programmed chips from a manufacturer or distributor, making it feasible to apply code or design changes in the middle of a production run.

In one approach, integrated circuits supporting ISP have internal circuitry to generate any necessary programming voltage from the system's normal supply voltage, and communicate off-chip via a serial protocol. One such serial protocol implemented in programmable logic devices is a variant of the Joint Test Action Group (JTAG) protocol for ISP, which facilitates easier integration with automated testing procedures. Other devices can use proprietary protocols or protocols defined by older standards. In other systems, designers may implement a JTAG-controlled programming subsystem for non-JTAG devices such as flash memory and microcontrollers, allowing the entire programming and test procedure to be accomplished under the control of a single protocol.

However, such a serial protocol approach presents various problems. The serial protocol can operate through one or more intermediate integrated circuits that are electrically in between the circuitry issuing programming instructions, and the target integrated circuit undergoing programming. This introduces complexity into the integrated circuits due to the additional circuitry which performs the serial protocol programming. Further, because the target integrated circuit undergoing programming shares electrical signals such as power, ground, clock, input, and output with other integrated circuits, other integrated circuits experience noise while programming the target integrated circuit.

It is therefore desirable to provide integrated circuits and methods of programming such devices which address the issues discussed above and result in improved in-system programming.

SUMMARY OF THE INVENTION

One aspect of the technology an apparatus comprising an integrated circuit, a package encasing the integrated circuit, a plurality of leads on the package, and an isolation circuit.

The integrated circuit includes circuitry performing memory operations. Power from only one of a first power lead and a second power lead is sufficient for the circuitry to operate.

The plurality of leads on the package electrically couple power and data from an exterior of the package to the integrated circuit encased by the package. The plurality of leads includes the first power lead, the second power lead, and a ground lead.

The isolation circuit electrically couples the circuitry to the first power lead but not the second lead at a first time, and electrically coupling the circuitry to the second power lead but not the first power lead at a second time.

In one embodiment of the technology, the isolation circuit is responsive to the power on the first power lead, by electrically coupling the first power lead to the circuitry, and by electrically decoupling the second power lead from the circuitry. The isolation circuit is responsive to the power on the second power lead, by electrically coupling the second power lead to the circuitry, and by electrically decoupling the first power lead from the circuitry.

In one embodiment of the technology, the isolation circuit includes a first p-type transistor and a second p-type transistor. The first p-type transistor is coupled in series between the first power lead and the circuitry, the first p-type transistor having a gate electrically coupled to the second power lead. The second p-type transistor is coupled in series between the second power lead and the circuitry, the second p-type transistor having a gate electrically coupled to the first power lead.

In one embodiment of the technology, the isolation circuit includes a first n-type transistor and a second n-type transistor. The first n-type transistor is coupled between the first power lead and a ground voltage, the first n-type transistor having a gate electrically coupled to the second power lead. The second n-type transistor is coupled between the second power lead and the ground voltage, the second n-type transistor having a gate electrically coupled to the first power lead.

In one embodiment of the technology, the plurality of leads on the package output data to the exterior of the package from the circuitry encased by the package. The plurality of leads includes a first output lead and a second output lead. The first output lead is used by the circuitry while drawing power from the first power lead. The second output lead is used by the circuitry while drawing power from the second power lead.

In another embodiment of the technology, the plurality of leads on the package input data from the exterior of the package to the integrated circuit encased by the package. The plurality of leads includes a first input lead and a second input lead. The first input lead is used by the circuitry while drawing power from the first power lead. The second input lead is used by the circuitry while drawing power from the second power lead.

In a further embodiment of the technology, the plurality of leads on the package electrically transfer input data and output data between the exterior of the package and the integrated circuit encased by the package. The plurality of leads includes a first input lead, a second input lead, and an output lead. The first input lead is used by the circuitry while drawing power from the first power lead. The second input lead is used by the circuitry while drawing power from the second power lead. The output lead is used by at least one of (i) the circuitry while drawing power from the first power lead and (ii) the circuitry while drawing power from the second power lead.

In yet another embodiment of the technology, the plurality of leads on the package electrically couples a clock signal from the exterior of the package to the integrated circuit encased by the package. The plurality of leads includes a first clock lead and a second clock lead. The first clock lead is used by the circuitry while drawing power from the first power lead. The second clock lead is used by the circuitry while drawing power from the second power lead.

In one embodiment of the technology, the in-system programming memory of the second set of circuitry is responsive to the first power lead drawing power to change the in-system programming.

In one embodiment of the technology, Joint Test Action Group (JTAG) circuitry is absent from the integrated circuit.

Another aspect of the technology an apparatus comprising an integrated circuit is a method, comprising:
during manufacturing, bringing into electrical contact with each other: (i) a plurality of leads of an integrated circuit programming tool, and (ii) a set of one or more packaged integrated circuits that are mounted on a printed circuit board, the printed circuit board having a plurality of circuit board traces electrically coupling together leads of different packaged integrated circuits that are mounted on the printed circuit board;
during manufacturing, programming the set of one or more packaged integrated circuits with the integrated circuit programming tool, by providing power and data from the plurality of leads of the integrated circuit programming tool to the set of one or more packaged integrated circuits, wherein the power is provided to a set of one or more power leads of the set of one or more packaged integrated circuits, and none of the leads of the set of one or more power leads is electrically coupled to any circuit board trace of the plurality of circuit board traces that electrically couple together leads of the different packaged integrated circuits that are mounted on the printed circuit board.

One embodiment of the technology further comprises, electrically coupling an internal power node of at least a first packaged integrated circuit of the one or more packaged integrated circuits, to only one of a first power lead and a second power lead of said at least the first packaged integrated circuit of the one or more packaged integrated circuits, the internal power node providing power to said at least the first integrated circuit of the one or more packaged integrated circuits.

One embodiment of the technology further comprises, electrically coupling the internal power node to one of the first power lead and the second power lead via only one of a first p-type transistor and a second p-type transistor,
electrically decoupling the internal power node from the other of the first power lead and the second power lead via the other of the first p-type transistor and the second p-type transistor,
wherein the first p-type transistor is coupled in series between the first power lead and the internal power node, the first p-type transistor having a gate electrically coupled to the second power lead, and
wherein the second p-type transistor is coupled in series between the second power lead and the internal power node, the second p-type transistor having a gate electrically coupled to the first power lead.

One embodiment of the technology further comprises, electrically coupling a ground reference to one of the first power lead and the second power lead via only one of a first n-type transistor and a second n-type transistor, electrically decoupling the ground reference from the other of the first power lead and the second power lead via the other of the first n-type transistor and the second p-type transistor,
wherein the first n-type transistor is coupled between the first power lead and the ground voltage, the first n-type transistor having a gate electrically coupled to the second power lead, and
wherein the second n-type transistor coupled between the second power lead and the ground voltage, the second n-type transistor having a gate electrically coupled to the first power lead.

In one embodiment of the technology, said programming bypasses Joint Test Action Group (JTAG) circuitry in the set of one or more packaged integrated circuits.

A further aspect of the technology an apparatus comprising an integrated circuit is a method, comprising:
during manufacturing, bringing into electrical contact with each other: (i) a plurality of leads of an integrated circuit programming tool, and (ii) a set of one or more packaged integrated circuits that are mounted on a printed circuit board, the set of one or more packaged integrated circuits having circuitry performing memory operations, a first set of one or more power leads and a second set of one or more power leads, wherein power from only the first set of power leads is sufficient for the circuitry to operate, and power from only the second set of power leads is sufficient for the circuitry to operate,
during manufacturing, programming the set of one or more packaged integrated circuits with the integrated circuit programming tool, by providing power and data from the plurality of leads of the integrated circuit programming tool to the set of one or more packaged integrated circuits, wherein the power is provided to the second set of one or more power leads of the set of integrated circuits, while not providing power to the first set of one or more power leads of the set of integrated circuits.

One embodiment of the technology further comprises, electrically coupling an internal power node providing power to the integrated circuit, to only one of a first power lead and a second power lead of at least a first packaged integrated circuit of the one or more packaged integrated circuits.

One embodiment of the technology further comprises, electrically coupling the internal power node to one of the first power lead and the second power lead via only one of a first p-type transistor and a second p-type transistor,
electrically decoupling the internal power node from the other of the first power lead and the second power lead via the other of the first p-type transistor and the second p-type transistor,
wherein the first p-type transistor is coupled in series between the first power lead and the internal power node, the first p-type transistor having a gate electrically coupled to the second power lead, and
wherein the second p-type transistor is coupled in series between the second power lead and the internal power node, the second p-type transistor having a gate electrically coupled to the first power lead.

One embodiment of the technology further comprises, electrically coupling a ground reference to one of the first power lead and the second power lead via only one of a first n-type transistor and a second n-type transistor, electrically decoupling the ground reference from the other of the first power lead and the second power lead via the other of the first n-type transistor and the second p-type transistor, wherein the first n-type transistor is coupled between the first power lead and the ground voltage, the first n-type transistor having a gate electrically coupled to the second power lead, and wherein the second n-type transistor coupled between the second power lead and the ground voltage, the second n-type transistor having a gate electrically coupled to the first power lead.

In one embodiment of the technology, said programming bypasses Joint Test Action Group (JTAG) circuitry in the set of one or more packaged integrated circuits.

Other aspects and advantages of the present invention can be seen on review of the drawings, the detailed description, and the claims which follow.

DETAILED DESCRIPTION

A detailed description of embodiments of the present invention is provided with reference to FIGS. 1 to 10.

Figure 1:
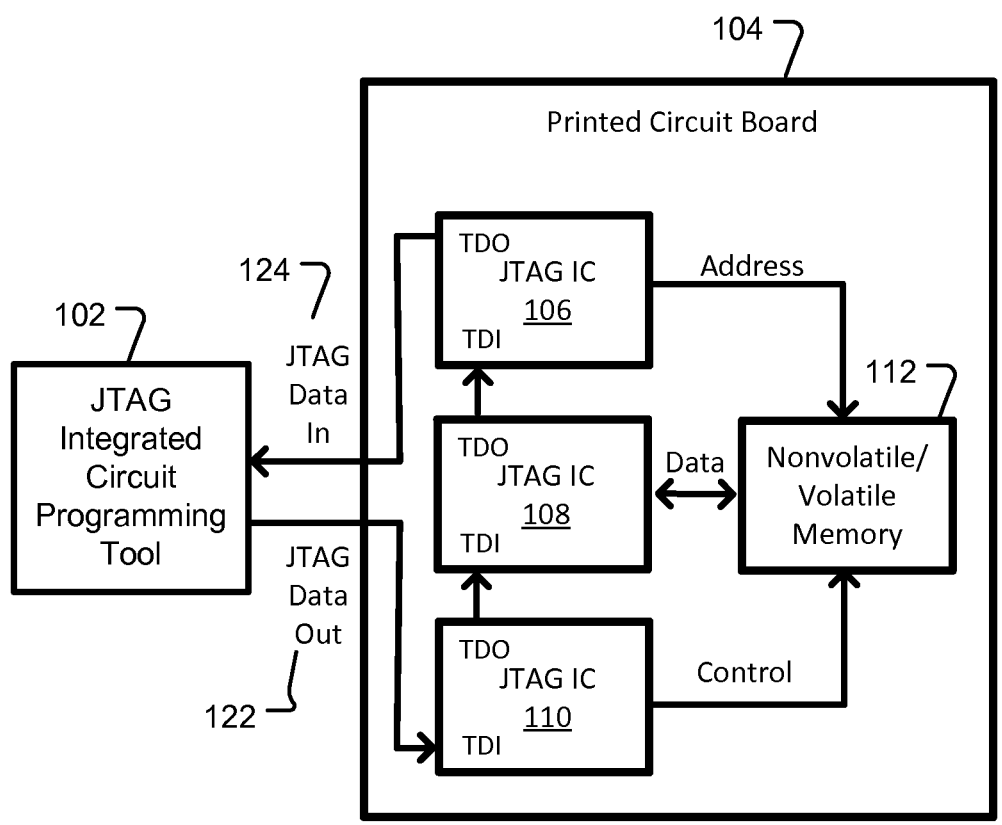
FIG. 1 is an example of a prior art system performing in-system programming, in which a JTAG programming tool performs in-system programming on integrated circuits that are mounted on a printed circuit board.

FIG. 1 is an example of a prior art system performing in-system programming, in which a JTAG programming tool performs in-system programming on integrated circuits that are mounted on a printed circuit board.

Printed circuit board 104 has multiple mounted integrated circuits, including JTAG ICs 106, 108, and 110; and non-volatile and/or volatile memory integrated circuit 112. JTAG integrated circuit programming tool 102 communicates with the integrated circuits mounted on printed circuit board 104, via the channels (i) JTAG data out 122 and (ii) JTAG data in 124. In FIG. 1 the JTAG IC's are coupled in a sequential order, such as JTAG IC 110, JTAG 108, and JTAG 106. Each of the JTAG ICs has TDI and TDO leads. The TDI lead of a preceding JTAG IC in the sequential order receives data from the TDI lead of a subsequent JTAG IC in the sequential order. The TDI lead of the first JTAG IC in the sequential order receives data from the JTAG integrated circuit programming tool 102. The TDO lead of the last JTAG IC in the sequential order sends data to the JTAG integrated circuit programming tool 102.

The different JTAG ICs communicate various signals with the nonvolatile and/or volatile memory integrated circuit 112. As shown, the nonvolatile and/or volatile memory integrated circuit 112 communicates the following: control signals with JTAG IC 110, data signals with JTAG IC 108, and address signals with JATG IC 106.

Figure 2:
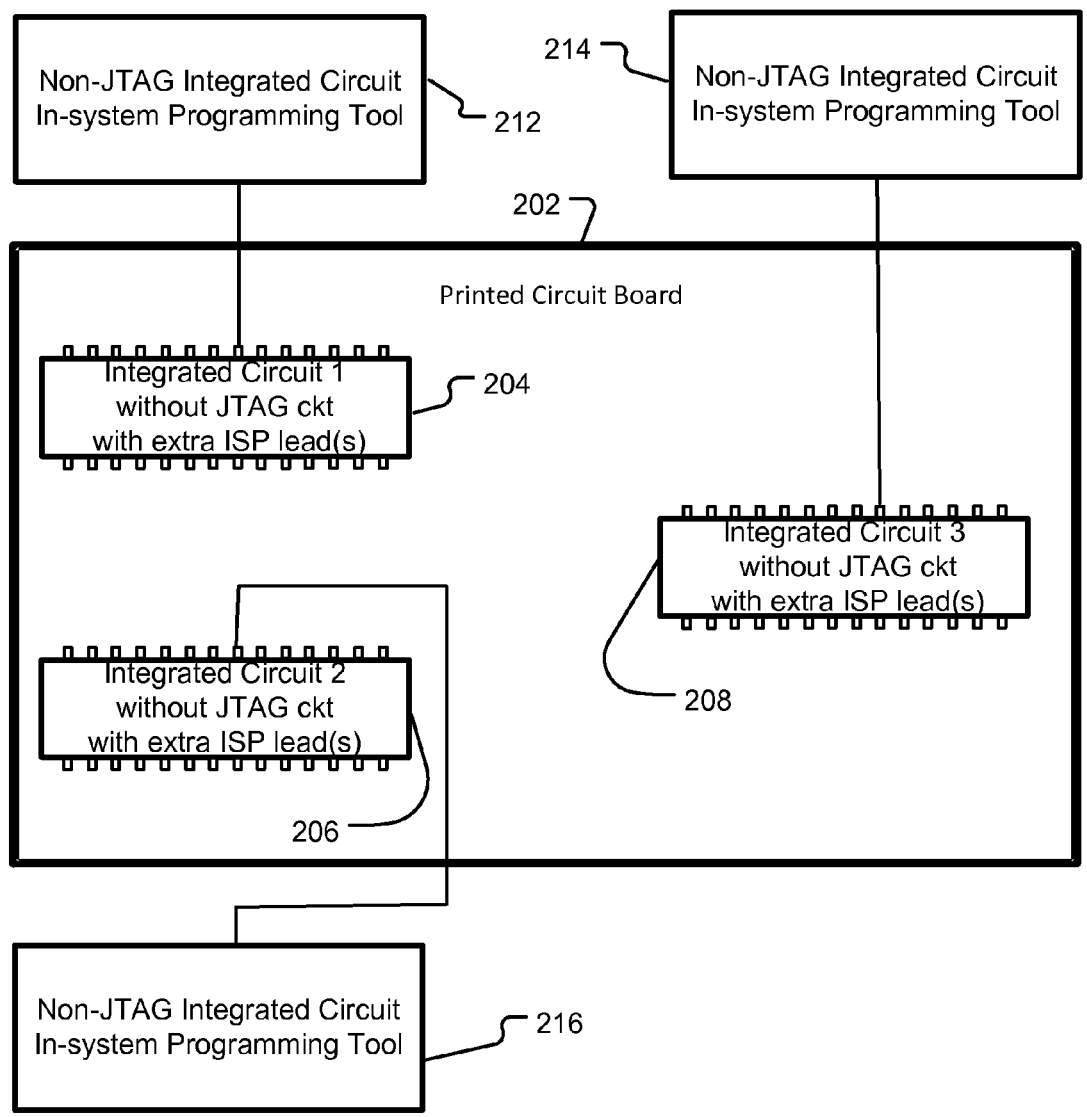
FIG. 2 is an example of a system performing in-system programming, in which a non-JTAG in-system programming tool performs in-system programming on at least one integrated circuit mounted on a printed circuit board, where such integrated circuits have at least one extra lead for in-system programming.

FIG. 2 is an example of a system performing in-system programming, in which a non-JTAG in-system programming tool performs in-system programming on at least one integrated circuit mounted on a printed circuit board, where such integrated circuits have at least one extra lead for in-system programming.

Figure 9:
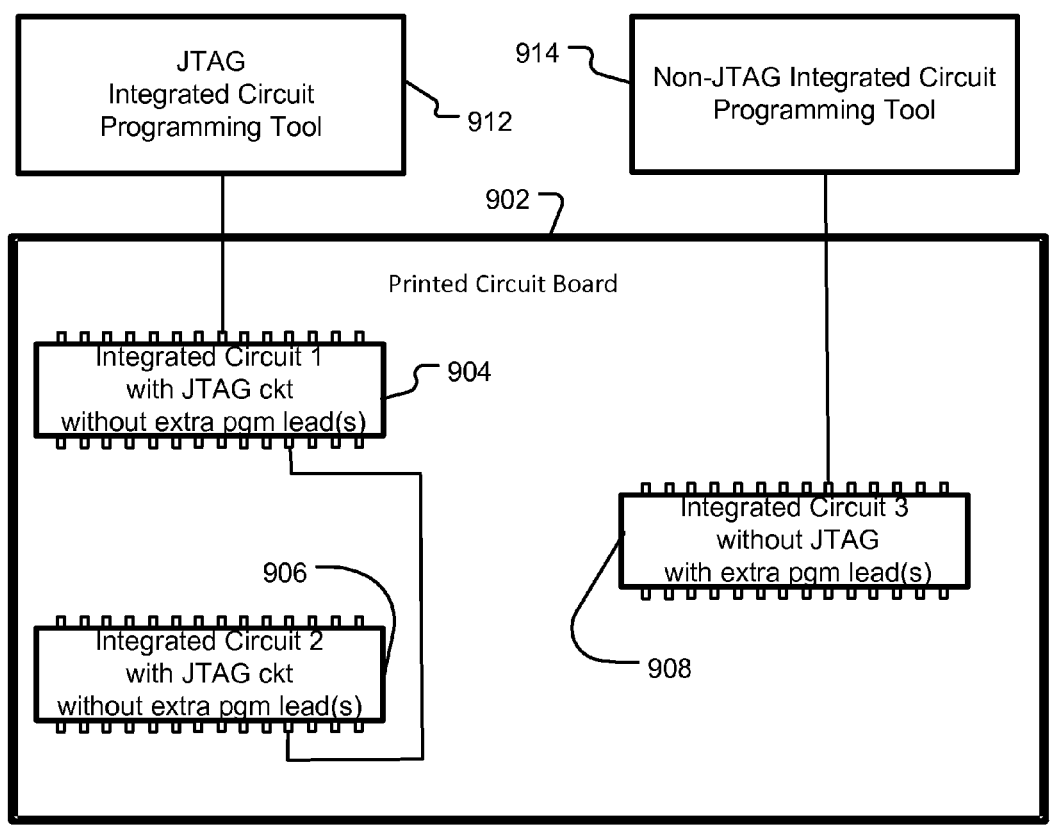
FIG. 9 is an example of a system performing in-system programming, in which a non-JTAG in-system programming tool performs in-system programming on at least one integrated circuit mounted on a printed circuit board, where such integrated circuits have at least one extra lead for in-system programming; and a JTAG in-system programming tool performs in-system programming on at least one integrated circuit mounted on a printed circuit board.
Figure 10:
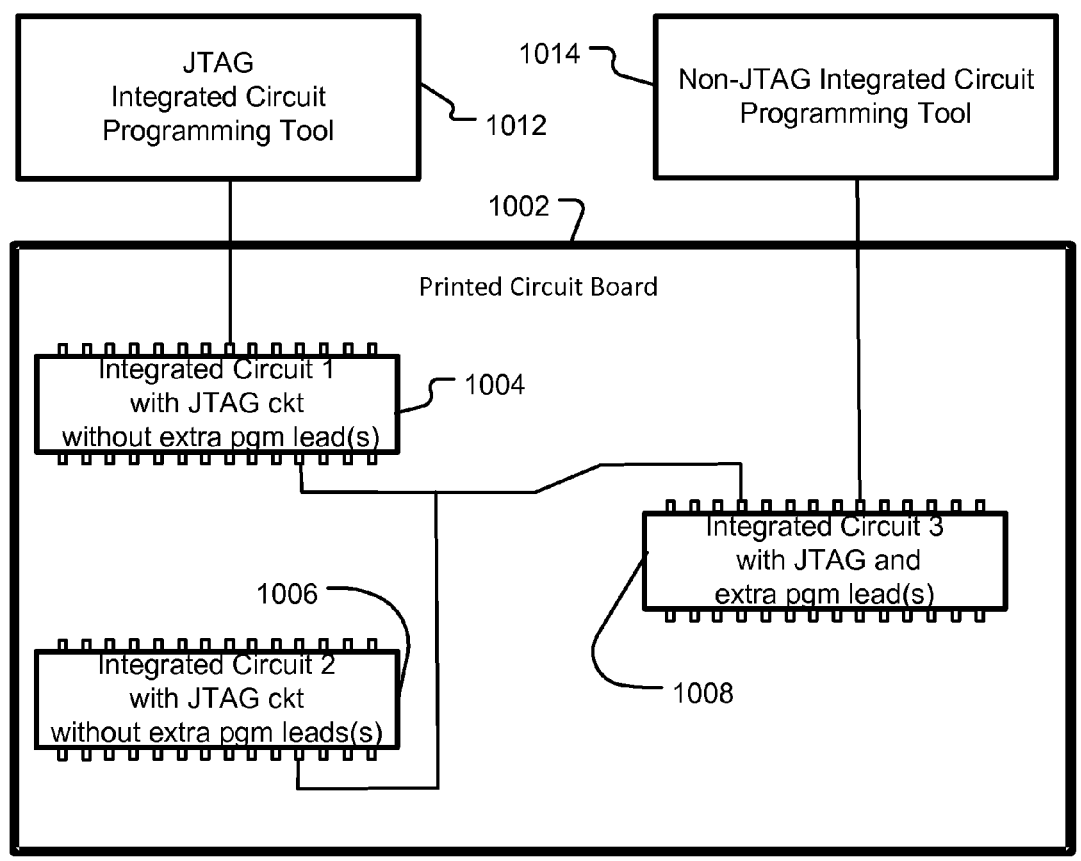
FIG. 10 is an example of a system performing in-system programming, in which a non-JTAG in-system programming tool performs in-system programming on at least one integrated circuit mounted on a printed circuit board, where such integrated circuits have at least one extra lead for in-system programming; and a JTAG in-system programming tool performs in-system programming on at least one integrated circuit mounted on a printed circuit board; and at least one integrated circuit mounted on the printed circuit board is programmed by both the non-JTAG in-system programming tool and the JTAG in-system programming tool.

Printed circuit board 202 has multiple mounted integrated circuits, including non-JTAG ICs with extra in-system programming lead(s) 204, 206, and 208 which lack JTAG circuitry. For comparison purposes with other embodiments shown in FIGS. 9 and 10, FIG. 2 shows multiple non-JTAG integrated circuit programming tools which perform in-system programming in parallel on multiple integrated circuits mounted on the printed circuit board. In other embodiments, one non-JTAG integrated circuit programming tool performs in-system programming in series, one at a time, on multiple integrated circuits mounted on the printed circuit board.

Non-JTAG integrated circuit programming tool 212 performs in-system programming on the integrated circuit 1 204, non-JTAG integrated circuit programming tool 216 performs in-system programming on the integrated circuit 2 206, and non-JTAG integrated circuit programming tool 214 performs in-system programming on the integrated circuit 3 208.

Printed circuit board 202 also has circuit board traces (not shown) electrically coupling together leads of multiple mounted integrated circuits, including integrated circuits 204, 206, and 208. Such leads that are coupled together allow access of the mission function memory in the non-JTAG ICs during conventional post-manufacturing use. Such leads can include one or more of Chip select; Output; Write protect; Reset; Clock; and Input, as shown in FIGS. 3 and 5-8. Because the traces electrically coupling together these leads do not receive power during in-system programming, non-JTAG integrated circuits do not experience noise during in-system programming.

The extra in-system programming leads of non-JTAG ICs with extra in-system programming lead(s) can include one or more of: P-Input; P-Output; P-Clock; and P-VCC, as shown in FIGS. 3 and 5-8. None of these extra in-system programming leads is electrically coupled to any circuit board trace that electrically couple together leads of the multiple packaged integrated circuits that are mounted on the printed circuit board, removing noise during in-system programming.

Figure 3:
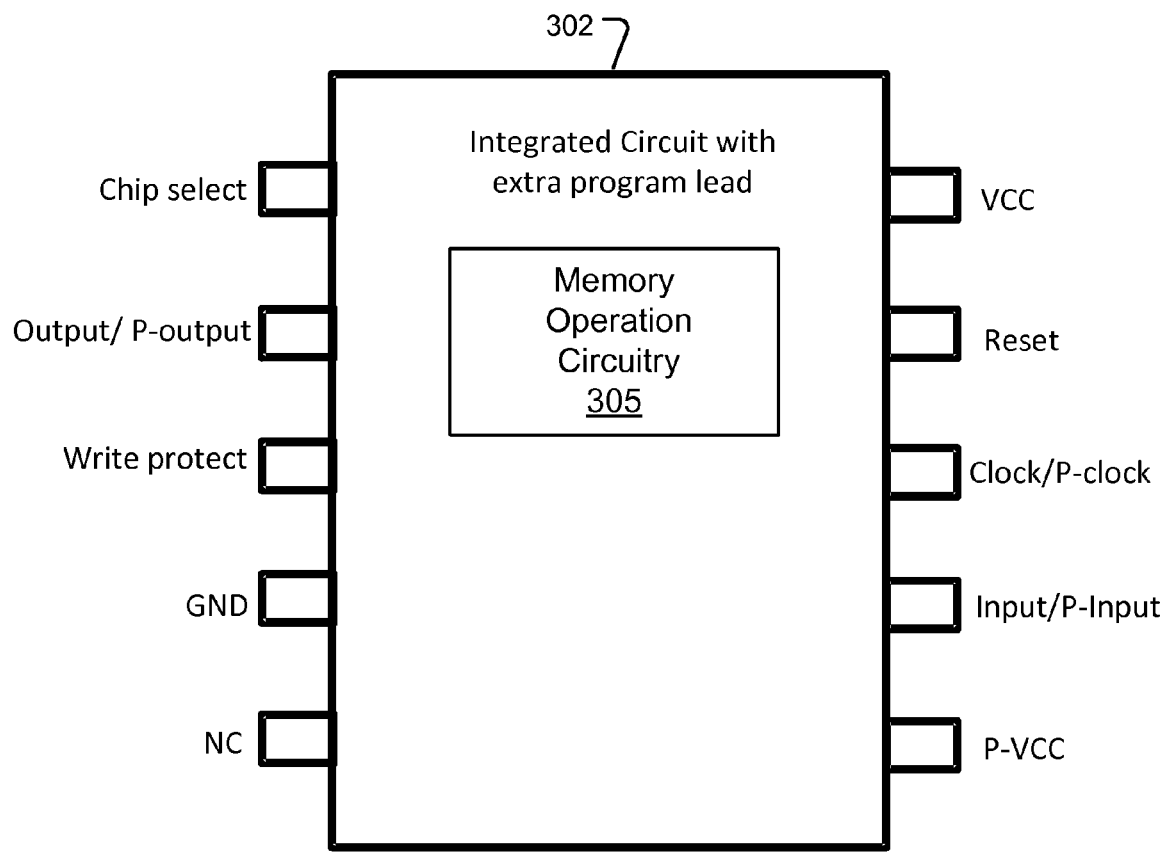
FIG. 3 is an example serial interface integrated circuit with an extra lead for in-system programming while mounted on a printed circuit board, where the extra lead is another power lead.

FIG. 3 is an example serial interface integrated circuit with an extra lead for in-system programming while mounted on a printed circuit board, where the extra lead is another power lead. Serial interface integrated circuit 302 has memory operation circuitry 305.

Various embodiments include memory operation circuitry which responds to off-chip commands by sending control signals to perform memory operations on a memory array, such as program, erase, and read. Memory operation circuitry 305 can program IC memory after the serial interface integrated circuit 302 is mounted on a printed circuit board, so that the manufacturer, who combines the integrated circuits on the printed circuit board, can program the IC memory in the manufacturer's own production line, rather than rely on the supplier of the serial interface integrated circuit 302 to preprogram the IC memory prior to delivery of the serial interface integrated circuit 302 to the manufacturer who combines the integrated circuits on the printed circuit board. The manufacturer can apply code or design changes in the middle of a production run, or otherwise customize the IC memory during manufacturing.

The serial interface integrated circuit 302 has the following leads: Chip select; Output/P-output; Write protect; GND; NC; P-VCC; Reset; Clock/P-clock; Input/P-Input; and P-VCC. A first subset of the leads can be used in connection with accessing the memory operation circuitry 305, includes: Chip select; Write protect; and Reset. A second subset of the leads can be used in connection with accessing the memory operation circuitry 305, includes P-VCC. A third subset of the leads can be used in connection with accessing memory operation circuitry 305 includes: Output/P-output; GND; Clock/P-clock; and Input/P-Input.

Figure 4:
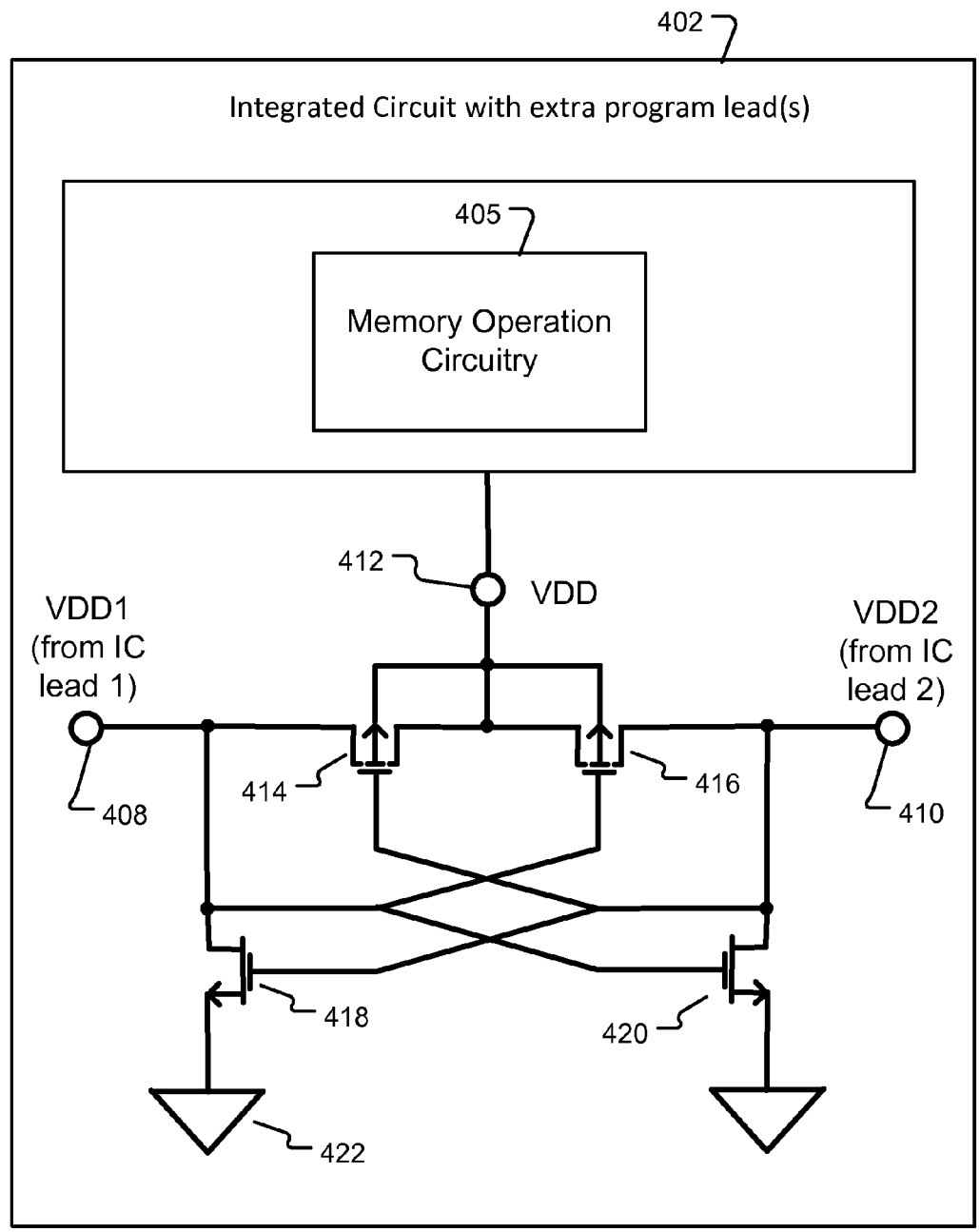
FIG. 4 is an example integrated circuit with at least one extra lead for in-system programming while mounted on a printed circuit board, and an isolation circuit which ensures that the integrated circuit receives power from only one of: (i) a power lead for in-system programming, and (ii) a power lead for use other than in-system programming.

FIG. 4 is an example integrated circuit with at least one extra lead for in-system programming while mounted on a printed circuit board, and an isolation circuit which ensures that the integrated circuit receives power from only one of: (i) a power lead for in-system programming, and (ii) a power lead for use other than in-system programming.

Integrated circuit 402 has memory operation circuitry 405. Integrated circuit 402 also has at least one extra power lead. VDD1 408 is provided by IC lead 1, and VDD2 410 is provided by IC lead 2. Memory operation circuitry 405 is responsive to VDD1 408 or to VDD2 410.

An isolation circuit allows internal power node VDD 412 to draw power from only one of VDD1 408 and VDD2 410. The following are coupled in series: VDD1 408, a first p-type transistor 414, a second p-type transistor 416, and VDD2 410; accordingly, the first p-type transistor 414 is coupled in series between VDD1 408 and VDD 412, and the second p-type transistor 416 is coupled in series between VDD2 410 and VDD 412. The first p-type transistor 414 has a gate electrically coupled to VDD2 410. The second p-type transistor 416 has a gate electrically coupled to VDD1 408.

A first n-type transistor 418 is coupled between VDD1 408 and a ground voltage 422. The first n-type transistor 418 has a gate electrically coupled to VDD2 410. A second n-type transistor 420 is coupled between VDD2 410 and the ground voltage 422. The second n-type transistor 420 has a gate electrically coupled to VDD1 408.

The isolation circuit is responsive to the received power VDD1 from IC lead 1, by electrically coupling VDD1 of IC lead 1 to internal power node VDD 412 to provide power to the integrated circuit, and by electrically decoupling VDD2 of IC lead 2 from internal power node VDD 412 of the integrated circuit. The isolation circuit is responsive to the received power VDD2 from IC lead 2, by electrically coupling VDD2 of IC lead 2 to the internal power node VDD 412 to provide power to the integrated power circuit, and by electrically decoupling VDD1 of IC lead 1 from internal power node VDD 412 of the integrated circuit.

Figure 5:
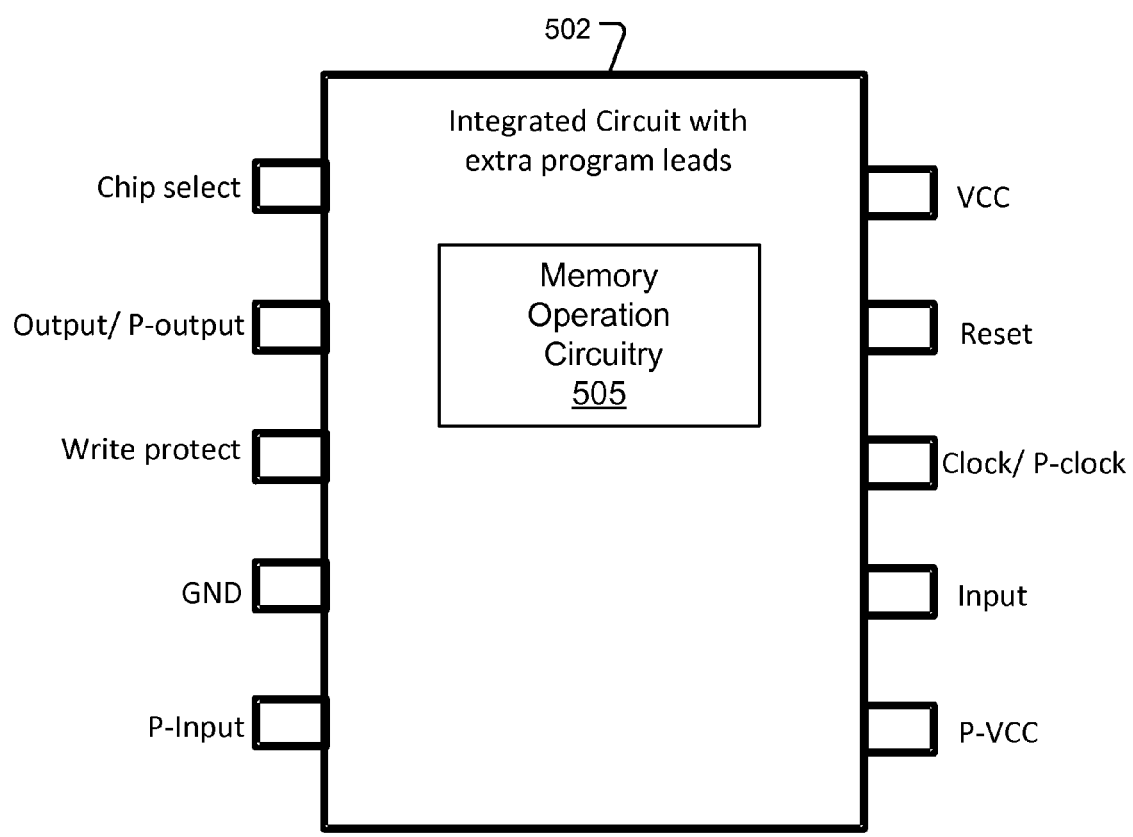
FIG. 5 is an example serial interface integrated circuit with extra leads for in-system programming while mounted on a printed circuit board, where the extra leads are another power lead and another input lead.

FIG. 5 is an example serial interface integrated circuit with extra leads for in-system programming while mounted on a printed circuit board, where the extra leads are another power lead and another input lead.

Figure 6:
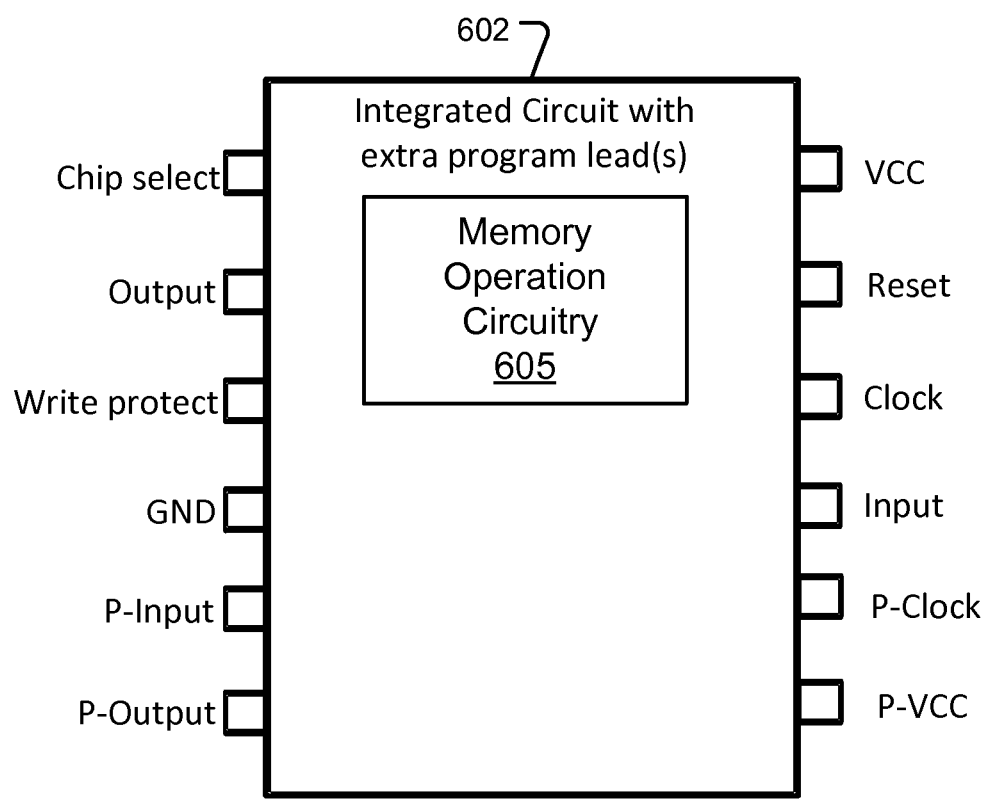
FIG. 6 is an example serial interface integrated circuit with extra leads for in-system programming while mounted on a printed circuit board, where the extra leads are another power lead, another input lead, another clock lead, and another output lead.

FIG. 6 is an example serial interface integrated circuit with extra leads for in-system programming while mounted on a printed circuit board, where the extra leads are another power lead, another input lead, another clock lead, and another output lead.

Figure 7:
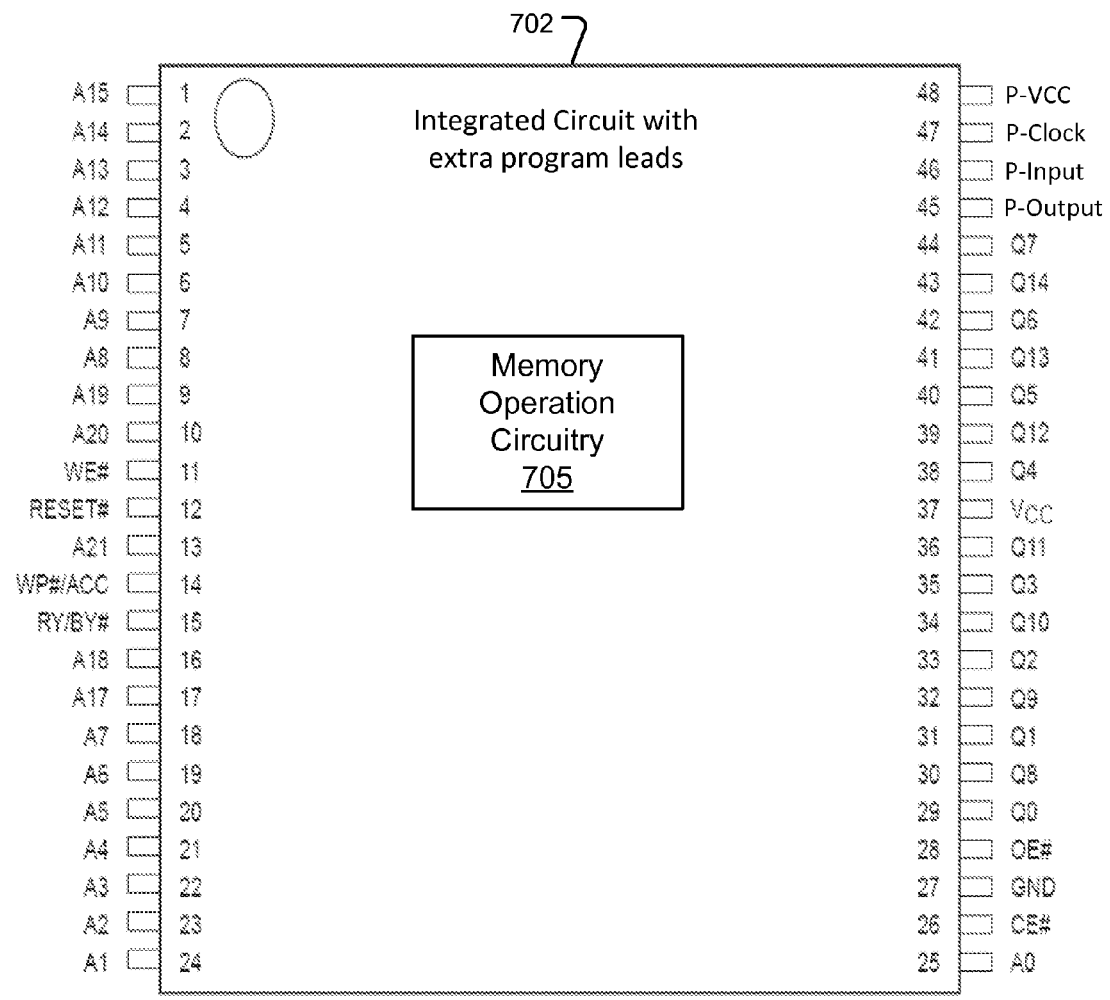
FIG. 7 is an example parallel interface integrated circuit with extra leads for in-system programming while mounted on a printed circuit board, where the extra leads are another power lead, another input lead, another clock lead, and another output lead.

FIG. 7 is an example parallel interface integrated circuit with extra leads for in-system programming while mounted on a printed circuit board, where the extra leads are another power lead, another input lead, another clock lead, and another output lead.

Figure 8:
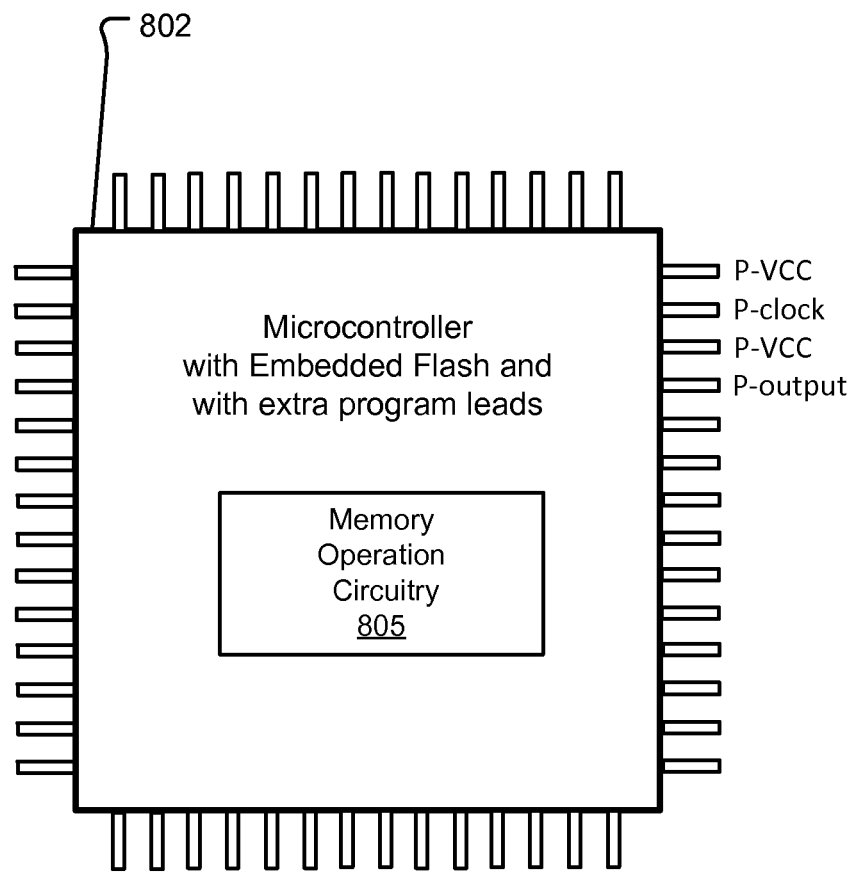
FIG. 8 is an example microcontroller integrated circuit with extra leads for in-system programming while mounted on a printed circuit board, where the extra leads are another power lead, another input lead, another clock lead, and another output lead.

FIG. 8 is an example microcontroller integrated circuit with extra leads for in-system programming while mounted on a printed circuit board, where the extra leads are another power lead, another input lead, another clock lead, and another output lead.

FIG. 9 is an example of a system performing in-system programming, in which a non-JTAG in-system programming tool performs in-system programming on at least one integrated circuit mounted on a printed circuit board, where such integrated circuits have at least one extra lead for in-system programming; and a JTAG in-system programming tool performs in-system programming on at least one integrated circuit mounted on a printed circuit board.

Printed circuit board 902 has multiple mounted integrated circuits, including JTAG ICs without extra in-system programming lead(s) 1 904 and 2 906, which have JTAG circuitry; and non-JTAG IC with extra in-system programming lead(s) 908 which lack JTAG circuitry. Unlike the embodiment shown in FIG. 2, FIG. 9 has not only a non-JTAG integrated circuit programming tool 914 which performs in-system programming, but also a JTAG integrated circuit programming tool 912 which performs in-system programming.

JTAG integrated circuit programming tool 912 performs in-system programming on the integrated circuit 1 904 and integrated circuit 2 906, both without extra in-system programming lead(s). Non-JTAG integrated circuit programming tool 914 performs in-system programming on the integrated circuit 3 908.

In various embodiments, in-system programming by non-JTAG integrated circuit programming tool 914 can be at least partly before, at least partly during, and/or at least partly after in-system programming by JTAG integrated circuit programming tool 912.

Printed circuit board 902 also has circuit board traces (not shown) electrically coupling together leads of multiple mounted integrated circuits, including integrated circuits 904, 906, and 908. Such leads that are coupled together allow access of the memory operation circuitry during conventional post-manufacturing use. Such leads can include one or more of Chip select; Output; Write protect; Reset; Clock; and Input, as shown in FIGS. 3 and 5-8. Because the traces electrically coupling together these leads do not receive power during in-system programming, non-JTAG integrated circuit 908 does not experience noise during in-system programming.

The extra in-system programming leads of non-JTAG ICs with extra in-system programming lead(s) can include one or more of: P-Input; P-Output; P-Clock; and P-VCC, as shown in FIGS. 3 and 5-8. None of these extra in-system programming leads is electrically coupled to any circuit board trace that electrically couple together leads of the multiple packaged integrated circuits that are mounted on the printed circuit board, removing noise during in-system programming.

FIG. 10 is an example of a system performing in-system programming, in which a non-JTAG in-system programming tool performs in-system programming on at least one integrated circuit mounted on a printed circuit board, where such integrated circuits have at least one extra lead for in-system programming; and a JTAG in-system programming tool performs in-system programming on at least one integrated circuit mounted on a printed circuit board; and at least one integrated circuit mounted on the printed circuit board is programmed by both the non-JTAG in-system programming tool and the JTAG in-system programming tool.

Printed circuit board 1002 has multiple mounted integrated circuits, including JTAG ICs without extra in-system programming lead(s) 1 1004 and 2 1006, which have JTAG circuitry. Printed circuit board 1002 also has mounted integrated circuit 3 1008 with JTAG circuitry and with extra in-system programming lead(s). Unlike the embodiments shown in FIGS. 2 and 9, FIG. 10 has an integrated circuit which can undergo programming by both a JTAG integrated circuit programming tool and a non-JTAG programming tool.

JTAG integrated circuit programming tool 1012 performs in-system programming on integrated circuit 1 1004, integrated circuit 2 1006, and integrated circuit 3 1008. Non-JTAG integrated circuit programming tool 1014 performs in-system programming on the integrated circuit 3 1008.

In various embodiments, in-system programming by non-JTAG integrated circuit programming tool 1014 can be before, or after in-system programming by JTAG integrated circuit programming tool 1012. In-system programming by non-JTAG integrated circuit programming tool 1014 does not overlap with in-system programming by JTAG integrated circuit programming tool 1012, at least to the extent that programming of integrated circuit 3 1008 does not occur simultaneously by both non-JTAG integrated circuit programming tool 1014 and in-system programming by JTAG integrated circuit programming tool 1012.

Printed circuit board 1002 also has circuit board traces (not shown) electrically coupling together leads of multiple mounted integrated circuits, including integrated circuits 1004, 1006, and 1008. Such leads that are coupled together allow access of the memory operation circuitry during conventional post-manufacturing use. Such leads can include one or more of Chip select; Output; Write protect; Reset; Clock; and Input, as shown in FIGS. 3 and 5-8. Because the traces electrically coupling together these leads do not receive power during in-system programming, integrated circuit 1008 does not experience noise during in-system programming.

The extra in-system programming leads of IC 1008 with extra in-system programming lead(s) can include one or more of: P-Input; P-Output; P-Clock; and P-VCC, as shown in FIGS. 3 and 5-8. None of these extra in-system programming leads is electrically coupled to any circuit board trace that electrically couple together leads of the multiple packaged integrated circuits that are mounted on the printed circuit board, removing noise during in-system programming.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An apparatus comprising:
an integrated circuit including:
   circuitry configured to perform memory operations;
   a package encasing the integrated circuit; and
   a plurality of leads on the package configured to electrically couple power and data from an exterior of the package to the integrated circuit encased by the package, including:
      a first power lead;
      a second power lead; and
      a ground lead; and
an isolation circuit configured to electrically couple the circuitry to the first power lead but not the second lead at a first time, and electrically couple the circuitry to the second power lead but not the first power lead at a second time, wherein the power from only one of the first power lead and the second power lead is sufficient for the circuitry to operate.

2. The device of claim 1, wherein:
the isolation circuit is responsive to the power on the first power lead, by electrically coupling the first power lead to the circuitry, and by electrically decoupling the second power lead from the circuitry at the first time, and
the isolation circuit is responsive to the power on the second power lead, by electrically coupling the second power lead to the circuitry, and by electrically decoupling the first power lead from the circuitry at the second time.

3. The device of claim 2,
wherein the isolation circuit includes:
a first p-type transistor coupled in series between the first power lead and the circuitry, the first p-type transistor having a gate electrically coupled to the second power lead; and
a second p-type transistor coupled in series between the second power lead and the circuitry, the second p-type transistor having a gate electrically coupled to the first power lead.

4. The device of claim 2,
wherein the isolation circuit includes:

a first n-type transistor coupled between the first power lead and a ground voltage, the first n-type transistor having a gate electrically coupled to the second power lead; and a second n-type transistor coupled between the second power lead and the ground voltage, the second n-type transistor having a gate electrically coupled to the first power lead.

5. The device of claim 1, wherein the plurality of leads on the package output data to the exterior of the package from the circuitry encased by the package, including:

a first output lead used by the circuitry while drawing power from the first power lead; and a second output lead used by the circuitry while drawing power from the second power lead.

6. The device of claim 1, wherein the plurality of leads on the package input data from the exterior of the package to the integrated circuit encased by the package, including:

a first input lead used by the circuitry while drawing power from the first power lead; and a second input lead used by the circuitry while drawing power from the second power lead.

7. The device of claim 1, wherein the plurality of leads on the package electrically transfer input data and output data between the exterior of the package and the integrated circuit encased by the package, including:

a first input lead used by the circuitry while drawing power from the first power lead;

a second input lead used by the circuitry while drawing power from the second power lead; and an output lead used by at least one of (i) the circuitry while drawing power from the first power lead and (ii) the circuitry while drawing power from the second power lead.

8. The device of claim 1, wherein the plurality of leads on the package electrically couples a clock signal from the exterior of the package to the integrated circuit encased by the package, including:

a first clock lead used by the circuitry while drawing power from the first power lead; and a second clock lead used by circuitry while drawing power from the second power lead.

9. The device of claim 1, wherein the circuitry includes a memory, and the circuitry is responsive to the first power lead drawing power to perform in-system programming by programming the memory.

10. The device of claim 1, wherein Joint Test Action Group (JTAG) circuitry is absent from the integrated circuit.

11. A method, comprising:

during manufacturing, bringing into electrical contact with each other: (i) a plurality of leads of an integrated circuit programming tool, and (ii) a set of one or more packaged integrated circuits that are mounted on a printed circuit board, the printed circuit board having a plurality of circuit board traces electrically coupling together leads of different packaged integrated circuits that are mounted on the printed circuit board;

during manufacturing, programming the set of one or more packaged integrated circuits with the integrated circuit programming tool, by providing power and data from the plurality of leads of the integrated circuit programming tool to the set of one or more packaged integrated circuits, wherein the power is provided to a set of one or more power leads of the set of one or more packaged integrated circuits, and none of the leads of the set of one or more power leads is electrically coupled to any circuit board trace of the plurality of circuit board traces that electrically couple together leads of the different packaged integrated circuits that are mounted on the printed circuit board.

12. The method of claim 11, further comprising:

electrically coupling an internal power node of at least a first packaged integrated circuit of the one or more packaged integrated circuits, to only one of a first power lead and a second power lead of said at least the first packaged integrated circuit of the one or more packaged integrated circuits, the internal power node providing power to said at least the first integrated circuit of the one or more packaged integrated circuits.

13. The method of claim 12, further comprising:

electrically coupling the internal power node to one of the first power lead and the second power lead via only one of a first p-type transistor and a second p-type transistor, electrically decoupling the internal power node from the other of the first power lead and the second power lead via the other of the first p-type transistor and the second p-type transistor, wherein the first p-type transistor is coupled in series between the first power lead and the internal power node, the first p-type transistor having a gate electrically coupled to the second power lead, and wherein the second p-type transistor is coupled in series between the second power lead and the internal power node, the second p-type transistor having a gate electrically coupled to the first power lead.

14. The method of claim 12, further comprising:

electrically coupling a ground reference to one of the first power lead and the second power lead via only one of a first n-type transistor and a second n-type transistor, electrically decoupling the ground reference from the other of the first power lead and the second power lead via the other of the first n-type transistor and the second p-type transistor, wherein the first n-type transistor is coupled between the first power lead and the ground voltage, the first n-type transistor having a gate electrically coupled to the second power lead, and wherein the second n-type transistor coupled between the second power lead and the ground voltage, the second n-type transistor having a gate electrically coupled to the first power lead.

15. The method of claim 11, wherein said programming bypasses Joint Test Action Group (JTAG) circuitry in the set of one or more packaged integrated circuits.

16. A method, comprising:

during manufacturing, bringing into electrical contact with each other: (i) a plurality of leads of an integrated circuit programming tool, and (ii) a set of one or more packaged integrated circuits that are mounted on a printed circuit board, the set of one or more packaged integrated circuits having circuitry performing memory operations, a first set of one or more power leads and a second set of one or more power leads, wherein power from only the first set of power leads is sufficient for the circuitry to operate, and power from only the second set of power leads is sufficient for the circuitry to operate; and during manufacturing, programming the set of one or more packaged integrated circuits with the integrated circuit programming tool, by providing power and data from the plurality of leads of the integrated circuit programming tool to the set of one or more packaged integrated circuits, wherein the power is provided to only one of the first set and the second set of power leads of the set of one or more packaged integrated circuits.

17. The method of claim 16, further comprising:

electrically coupling an internal power node providing power to only one of a first power lead and a second power lead of at least a first packaged integrated circuit of the one or more packaged integrated circuits.

18. The method of claim 17, further comprising:

electrically coupling the internal power node to one of the first power lead and the second power lead via only one of a first p-type transistor and a second p-type transistor, electrically decoupling the internal power node from the other of the first power lead and the second power lead via the other of the first p-type transistor and the second p-type transistor, wherein the first p-type transistor is coupled in series between the first power lead and the internal power node, the first p-type transistor having a gate electrically coupled to the second power lead, and wherein the second p-type transistor is coupled in series between the second power lead and the internal power node, the second p-type transistor having a gate electrically coupled to the first power lead.

19. The method of claim 17, further comprising:

electrically coupling a ground reference to one of the first power lead and the second power lead via only one of a first n-type transistor and a second n-type transistor, electrically decoupling the ground reference from the other of the first power lead and the second power lead via the other of the first n-type transistor and the second p-type transistor, wherein the first n-type transistor is coupled between the first power lead and the ground voltage, the first n-type transistor having a gate electrically coupled to the second power lead, and wherein the second n-type transistor coupled between the second power lead and the ground voltage, the second n-type transistor having a gate electrically coupled to the first power lead.

20. The method of claim 16, wherein said programming bypasses Joint Test Action Group (JTAG) circuitry in the set of one or more packaged integrated circuits.

\* \* \* \* \*